US011763827B2

(12) United States Patent
Murmann et al.

(10) Patent No.: US 11,763,827 B2
(45) Date of Patent: Sep. 19, 2023

(54) N-PATH SPECTRAL DECOMPOSITION IN ACOUSTIC SIGNALS

(71) Applicant: The Board of Trustees of the Leland Stanford Junior University, Stanford, CA (US)

(72) Inventors: Boris Murmann, Stanford, CA (US); Daniel Augusto Villamizar, Woodinville, WA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 21 days.

(21) Appl. No.: 17/085,481

(22) Filed: Oct. 30, 2020

(65) Prior Publication Data

US 2021/0134307 A1 May 6, 2021

Related U.S. Application Data

(60) Provisional application No. 62/927,825, filed on Oct. 30, 2019.

(51) Int. Cl.
*G10L 19/02* (2013.01)
(52) U.S. Cl.
CPC ................................. *G10L 19/02* (2013.01)
(58) Field of Classification Search
None
See application file for complete search history.

(56) References Cited

U.S. PATENT DOCUMENTS

| 8,428,945 | B2 | 4/2013 | Zakarauskas |
|---|---|---|---|
| 2015/0133068 | A1 | 5/2015 | Aggarwal |
| 2016/0043756 | A1* | 2/2016 | Su ..................... H04W 72/0446 |
| | | | 375/350 |
| 2018/0358992 | A1* | 12/2018 | Fernando ............. H04B 1/0057 |
| 2019/0221203 | A1 | 7/2019 | Gao |
| 2019/0259378 | A1 | 8/2019 | Khadloya |
| 2019/0305803 | A1* | 10/2019 | Winiecki ................. H04B 1/02 |

(Continued)

FOREIGN PATENT DOCUMENTS

WO    WO-2006043115 A1 *   4/2006    ......... H04B 7/18515

OTHER PUBLICATIONS

M. Cho et al., "17.2 A 142nW Voice and Acoustic Activity Detection Chip for mm-Scale Sensor Nodes Using Time-Interleaved Mixer-Based Frequency Scanning," 2019 IEEE International Solid-State Circuits Conference—(ISSCC), 2019, pp. 278-280, doi: 10.1109/ISSCC.2019.8662540. (Year: 2019).*

(Continued)

*Primary Examiner* — Richemond Dorvil
*Assistant Examiner* — Alexander G Marlow
(74) *Attorney, Agent, or Firm* — LUMEN PATENT FIRM

(57) ABSTRACT

A method and device for extracting information from acoustic signals receives acoustic signals by a microphone, processes them in an analog front-end circuit, converts the processed signals from the analog front-end circuit to digital signals by sampling at a rate of less than 1 kHz or more preferably less than 500 kHz; and processes the digital signals by a digital back-end classifier circuit. The analog front-end processing decomposes the received signals into frequency components using a bank of analog N-path bandpass filters having different subband center frequencies.

2 Claims, 8 Drawing Sheets

(56) References Cited

U.S. PATENT DOCUMENTS

2019/0325899 A1* 10/2019 Dehghani ............ G10L 21/0308
2020/0150919 A1* 5/2020 Rand ...................... H04R 1/406

OTHER PUBLICATIONS

K. M. H. Badami, S. Lauwereins, W. Meertand M. Verheist, "A 90 nm CMOS, 6 µW Power-Proportional Acoustic Sensing Frontend for Voice Activity Detection," in IEEE Journal of Solid-State Circuits, vol. 51, No. 1, pp. 291-302, Jan. 2016, doi: 10.1109/JSSC.2015.2487276. (Year: 2016).*

K. M. H. Badami, S. Lauwereins, W. Meertand M. Verheist, "A 90 nm CMOS, 6 UW Power-Proportional Acoustic Sensing Frontend for Voice Activity Detection," in IEEE Journal of Solid-State Circuits, vol. 51, No. 1, pp. 291-302, Jan. 2016, doi: 10.1109/JSSC.2015.2487276. (Year: 2016).*

Ellis et al., Classifying soundtracks with audio texture features, in IEEE Int. Conf. Acoust. Speech Signal Process. (ICASSP), May 2011, pp. 5880-5883 (Year: 2011).*

E. A. M. Klumperink, H. J. Westerveld and B. Nauta, "N-path filters and mixer-first receivers: A review," 2017 IEEE Custom Integrated Circuits Conference (CICC), 2017, pp. 1-8, doi: 10.1109/CICC.2017.7993643. (Year: 2017).*

C. Salazar, A. Cathelin, A. Kaiser and J. Rabaey, "A 2.4 GHz Interferer-Resilient Wake-Up Receiver Using A Dual-IF Multi-Stage N-Path Architecture," in IEEE Journal of Solid-State Circuits, vol. 51, No. 9, pp. 2091-2105, Sep. 2016, doi: 10.1109/JSSC.2016.2582509. (Year: 2016).*

Sound Classification using Summary Statistics and N-Path Filtering, Conference: 2019 IEEE International Symposium on Circuits and Systems (ISCAS), May 2019.

McDermott et al., Sound Texture Perception via Statistics of the Auditory Periphery: Evidence from Sound Synthesis, Neuron, 2011, vol. 71, Issue 5, p. 926-940.

Jeong et al., Always-On 12-nW Acoustic Sensing and Object Recognition Microsystem for Unattended Ground Sensor Nodes, IEEE Journal of Solid-State Circuits, vol. 53, No. 1, Jan. 2018.

Komail M. H. Badami et al., A 90 nm CMOS, 6 µW Power-Proportional Acoustic Sensing Frontend for Voice Activity Detection, IEEE Journal of Solid-State Circuits, vol. 51, No. 1, Jan. 2016, p. 291.

Yang et al., A 1µW Voice Activity Detector Using Analog Feature Extraction and Digital Deep Neural Network, 2018 IEEE International Solid-State Circuits Conference.

Ellis et al., Classifying soundtracks with audio texture features, in IEEE Int. Conf. Acoust. Speech Signal Process. (ICASSP), May 2011, pp. 5880-5883.

* cited by examiner

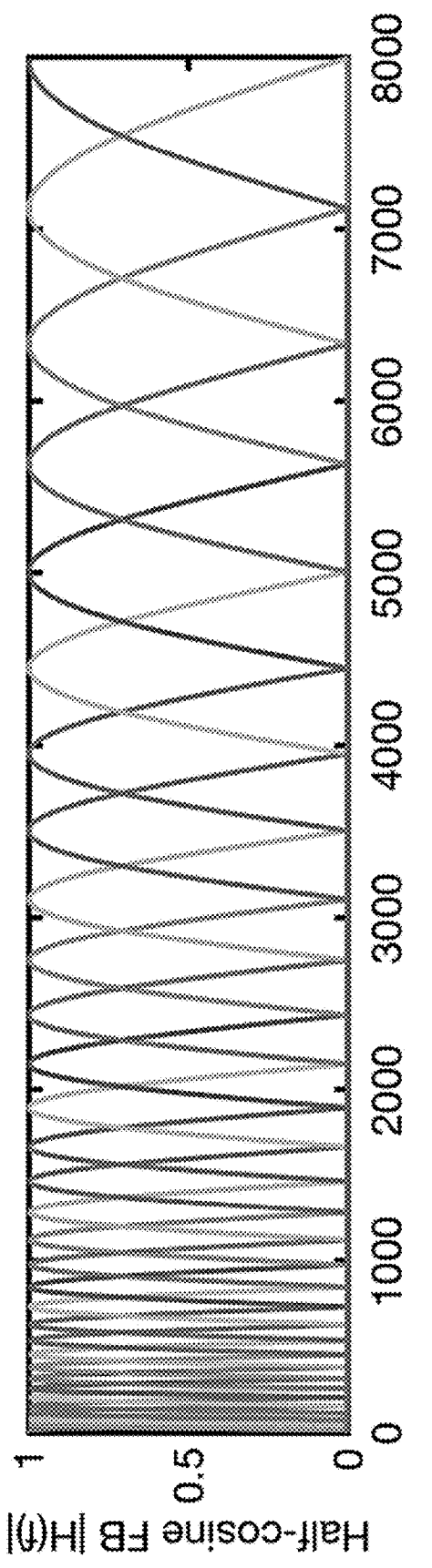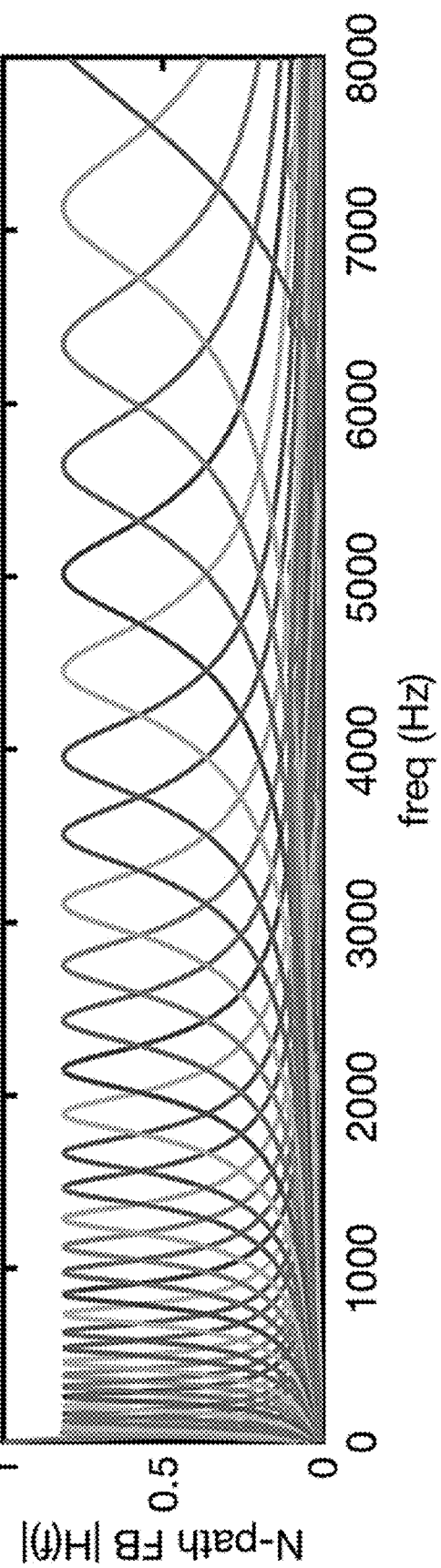

N-PATH SPECTRAL DECOMPOSITION IN ACOUSTIC SIGNALS

CROSS-REFERENCE TO RELATED APPLICATIONS

This application claims priority from U.S. Provisional Patent Application 62/927,825 filed Oct. 30, 2019, which is incorporated herein by reference.

FIELD OF THE INVENTION

The present invention relates generally to audio signal processing. More specifically, it relates to devices and methods for sound classification.

BACKGROUND OF THE INVENTION

Sound classification is a topic of active research due to its broad range of applications.

To perform sound classification, acoustic signals are often decomposed into their frequency components in order to extract useful information from them. This process can consume a significant portion of the total energy of a sensor system.

Recent advances in deep learning perform very well for sound classification tasks but their accuracy comes at the cost of high complexity, high computational loads, and large training datasets.

For Internet of Everything (IoE) systems, it is important to perform sound classification in real time, using low power, and in an always-on fashion [1], [2], [3]. To stay within their power budgets, IoE systems that rely on computationally demanding techniques must therefore resort to cloud processing. However, cloud processing introduces data latency and privacy issues.

It thus remains a challenge to perform accurate sound classification in real time, using low power, and in an always-on fashion.

BRIEF SUMMARY OF THE INVENTION

The present invention provides a technique for sound classification which lowers the energy consumption of spectral decomposition using summary statistics for classifying semi-stationary sounds. The technique uses a mixed-signal design using N-path filters for feature extraction to further improve energy efficiency without incurring a large accuracy penalty for a binary classification task (less than 2.5% area reduction under receiver operating characteristic curve).

The technique enables a front-end implementation that lowers the combined energy of computation and digitization when compared to an all-digital counterpart if the processed signal is lower than 8-10 ENOB. Compared to contemporary solutions including deep learning, this approach requires one to three orders of magnitude fewer parameters and can therefore be trained over ten times faster.

The invention provides, in one aspect, a method for extracting information from acoustic signals by decomposing them into their frequency components via filtering the original waveform using N-path filters. The resulting signals are passively down-converted to zero frequency to lower their Nyquist-rate bandwidth. These filters can be implemented in the analog domain where they exhibit low-power consumption and a simple design.

In one aspect, the invention provides a method for extracting information from acoustic signals, the method comprising: receiving the acoustic signals by a microphone; processing the received signals in an analog front-end circuit; converting the processed signals from the analog front-end circuit to digital signals by sampling at a rate of less than 1 kHz; and processing the digital signals by a digital back-end classifier circuit; wherein processing the received signals in the analog front-end comprises decomposing the received signals into frequency components using a bank of analog N-path bandpass filters having different subband center frequencies. Processing the received signals in the analog front-end may also comprise direct down-converting the N-path filtered signals to baseband using analog passive low-pass mixers to produce subband envelope signals.

In another aspect, the invention provides a device for extracting information from acoustic signals, the device comprising: a microphone; an analog front-end circuit; a digital-to-analog converter configured to sample at a rate of less than 1 kHz; and a digital back-end classifier circuit; wherein the analog front-end comprises a bank of analog N-path bandpass filters having different subband center frequencies for decomposing the received signals into frequency components. The analog front-end may also comprise analog passive low-pass mixers for direct down-converting the N-path filtered signals to produce subband envelope signals at baseband.

BRIEF DESCRIPTION OF THE SEVERAL VIEWS OF THE DRAWINGS

FIGS. 6A-6B are graphs showing perfect reconstruction half-cosine filter bank and
N-path implementation, respectively.

DETAILED DESCRIPTION OF THE INVENTION

Figure 1:
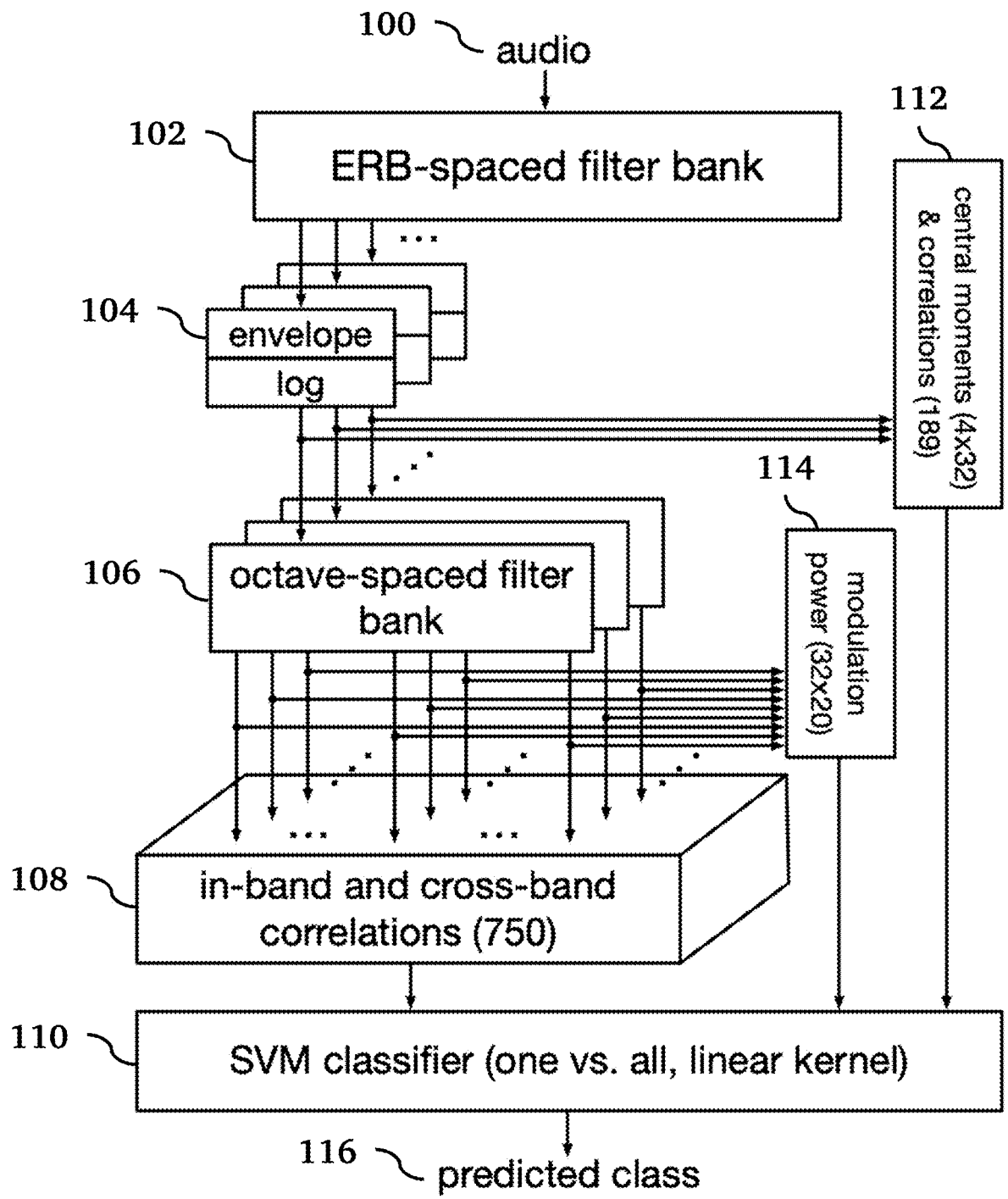
FIG. 1 is a processing pipeline of a SS-SVM classifier according to an embodiment of the invention.

Sound classification systems for IoT applications should satisfy a variety of constraints. To implement local inference at low power consumption, model parameter count should be restricted as much as possible. Further, for emerging applications where only limited training data is available, it is imperative to have a model that can quickly converge on trained parameters. Finally, it is desirable to benefit from application-specific simplifications when there is a priori knowledge about the signals of interest. To meet these conditions, the present invention provides a classifier that employs summary statistics as efficient and flexible features. Compared to other classifiers designed for the same tasks, this classifier design can train 10× faster while being 1000× smaller than a deep learning network and only exhibiting moderate accuracy loss. The classifier can be realized in a CMOS chip implementation designed to perform signal processing at ultra-low power while maintaining flexibility for a variety of applications.

Embodiments of the invention use a classification using a summary statistics feature set. Distinguishing sounds that are not strictly stationary but exhibit semi-stationary properties is a useful task for many IoE systems. These types of signals lend themselves to processing techniques that exploit their structure. Examples of sounds that fall into this category include motors, rain, a crowded room, insects, baby cry, sirens, applause, and even voice timbre. Extracting useful information from these types of signals in a computationally-efficient manner requires a feature set designed with this purpose in mind.

Embodiments of the invention adapt a set of statistics that represent human auditory cortex functionality. An important benefit of this technique is that it maps into an efficient circuit implementation in CMOS technology, as will be described in further detail in relation to FIG. 5, below.

The summary statistics (SS) feature set is composed of four main categories: (1) audio sub-band central moments, (2) sub-band correlations, (3) modulation-band power, and (4) modulation-band correlations. The audio sub-bands are filtered frequencies that are $ERB_N$ spaced to mimic the human cochlear auditory filters and the signal envelope is computed from each filtered channel. Central moments are extracted from each sub-band channel envelope and correlation coefficients are computed. Following the notation given in [4] we denote the $k^{th}$ sub-band envelope by $s_{k(t)}$, $k \in \{1 \ldots K\}$ for K=32 audio sub-bands and employ a windowing function w(t). The first four central moments are therefore computed following their traditional definitions:

$$M1_k = \mu_k = \sum_t w(t) s_k(t)$$

$$M2_k = \frac{\sigma_k^2}{\mu_k^2} = \sum_t w(t)(s_k(t) - \mu_k)^2$$

$$M3_k = \frac{\sum_t w(t)(s_k(t) - \mu_k)^3}{\sigma_k^3}$$

$$M4_k = \frac{\sum_t w(t)(s_k(t) - \mu_k)^4}{\sigma_k^4}$$

The sub-band correlations are defined as:

$$C_{jk} = \sum_t \frac{w(t)(s_j(t) - \mu_j)(s_k(t) - \mu_k)}{\sigma_j \sigma_k}$$

with $j \in \{1 \ldots 32\}$ and $(k-j) \in \{1, 2, 3, 5, 8, 11, 16, 21\}$

The modulation-band power is defined as:

$$M_{k,n} = \frac{\sum_t w(t) b_{k,n}(t)^2}{\sigma_k^2}$$

where $b_{k,n}(t)$ is the $n^{th}$ modulation band derived from the $k^{th}$ sub-band and $n \in \{1 \ldots N\}$ for N=20.

The modulation correlations C1 and C2 are defined as:

$$C1_{jk,n} = \frac{\sum_t w(t) \widetilde{b_{j,n}}(t) \widetilde{b_{k,n}}(t)}{\sigma_{j,n} \sigma_{k,n}}$$

$$C2_{k,mn} = \frac{\sum_t w(t) d_{k,m}(t)^* a_{k,n}(t)}{\sigma_{k,m} \sigma_{k,n}}$$

where $\widetilde{b_{k,n}}(t)$ is the subset of modulation bands that are octave-spaced apart in each of the $k^{th}$ sub-bands, $a_{k,n}(t)$ is the analytic signal of $\widetilde{b_{k,n}}(t)$, $m \in \{1 \ldots 6\}$, (n−m)=1, and $\sigma_{k,n}$ is the standard deviation of $w(t)\widetilde{b_{k,n}}(t)$. The signal $d_{k,n}(t)$ is the frequency-doubled version of $a_{k,n}(t)$:

$$d_{k,n}(t) = \frac{a_{k,n}^2(t)}{\|a_{k,n}\|}$$

where * and $\|\cdot\|$ denote the complex conjugate and modulus, respectively. Using these definitions, the vector defined as $v = [M1_k, M2_k, M3_k, M4_k, C_{jk}, M_{k,n}, C1_{jk,n}, C2_{k,mn}]$ for all values of k,n,j, and m as defined above constitutes the feature set used in a subsequent classifier.

We evaluated the feature set with multiple models and concluded that the performance of the classification is dominated by the mapping expressiveness of the features and not the classifier model used. We therefore chose a Support Vector Machine (SVM) model employing a linear kernel to ensure low inference computation cost. We therefore refer to the classifier as SS-SVM. For this model choice, the number of learned parameters are simply given by M×D where M is the number of classes and D is the number of features used. Performance tradeoff comparisons between this classifier and recent published work are summarized in the following sections.

The SVM model was implemented using the liblinear package using one-vs-all learners for multi-class tasks. Regularization hyper-parameter was optimized for each training run. Experiments using RBF or quadratic kernels did not yield appreciable gains. Other classifiers tested include Gaussian Discriminant Analysis and Multinomial Logistic Regression which also did not perform significantly different than the SVM model used.

The SS-SVM classifier diagram of FIG. 1 shows the signal chain. Features are flattened and concatenated as inputs to an SVM classifier. Audio 100 enters the signal chain and passes first through an ERB-spaced filter bank 102, which separates the signal into sub-bands. The sub-bands pass separately through envelopes 104, and then through octave-spaced filter banks 106. The outputs of the octave spaced filter bank are used to compute in-band and cross-band correlations 108. These correlations as well as the results from the computation of central moments and correlations 112 and modulation power 114 constitute the feature set. Finally, SVM classifier 110 produces a predicted class 116.

Figure 3:
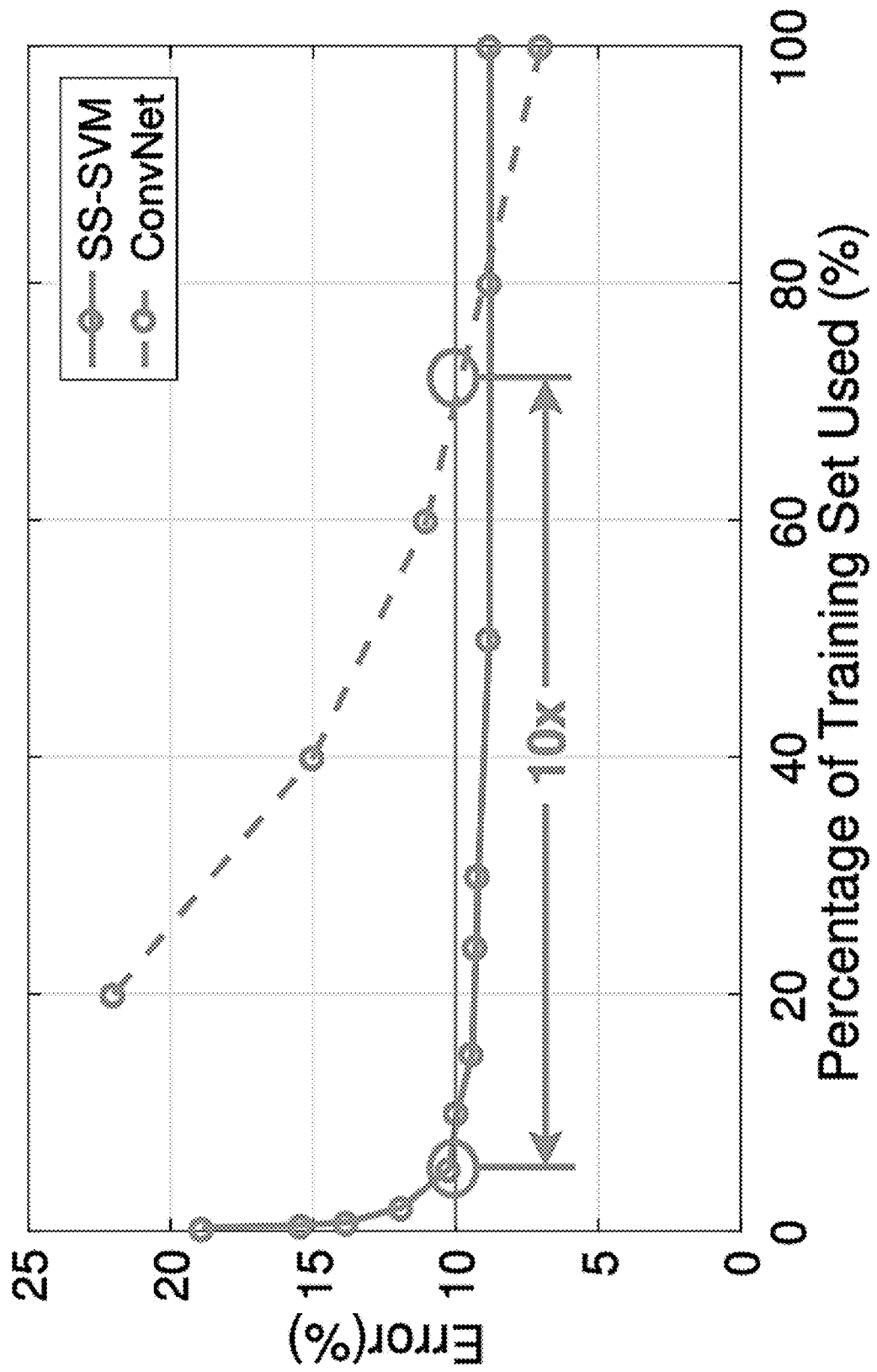
FIG. 3 is a graph or error vs. training samples comparing the learning rates of two classifiers.

The learning rate of the classifier system of the present invention was compared to a convolutional neural network designed for the same task (FIG. 3)

Deep learning techniques are increasingly being used for the tasks of environmental sound detection. For example, out of the top-10 submitted entries to the 2016 and 2017 DCASE challenges [6], [7], fifteen use ConvNets either exclusively or in combination with other feature extracting techniques.

A similar task of practical application (but lower complexity) is that of detecting baby cry events. In order to compare the tradeoffs between deep learning and the summary statistics classifier we designed a ConvNet for baby cry detection. The input to the network is a 5 second mel-spaced spectrogram of 40 frequency bins and 250 time frames of 20 ms duration computed from the raw audio signal. The network is summarized in Table I. A ReLU activation function was used after max pooling for all convolutional layers. Similar networks have been reported in [8], [9], [10], [11].

TABLE I

CONVNET EMPLOYED FOR BABY CRY DETECTION

| layer name | output size | layer parameters |
|---|---|---|
| input | 250 × 40 | |
| conv1 | 84 × 14 | 5 × 5, 8, stride 1, batch norm<br>3 × 3 max pool, stride 3<br>dropout p = 0.1 |
| conv2 | 29 × 6 | 5 × 5, 16, stride 1, batch norm<br>3 × 3 max pool, stride 3<br>dropout p = 0.2 |
| output | 1 × 1 | 1024-d, fc, softmax<br>dropout p = 0.5 |
| FLOPs | | $12.5 \times 10^6$ |
| Parameters | | $2.89 \times 10^6$ |

Figure 2:
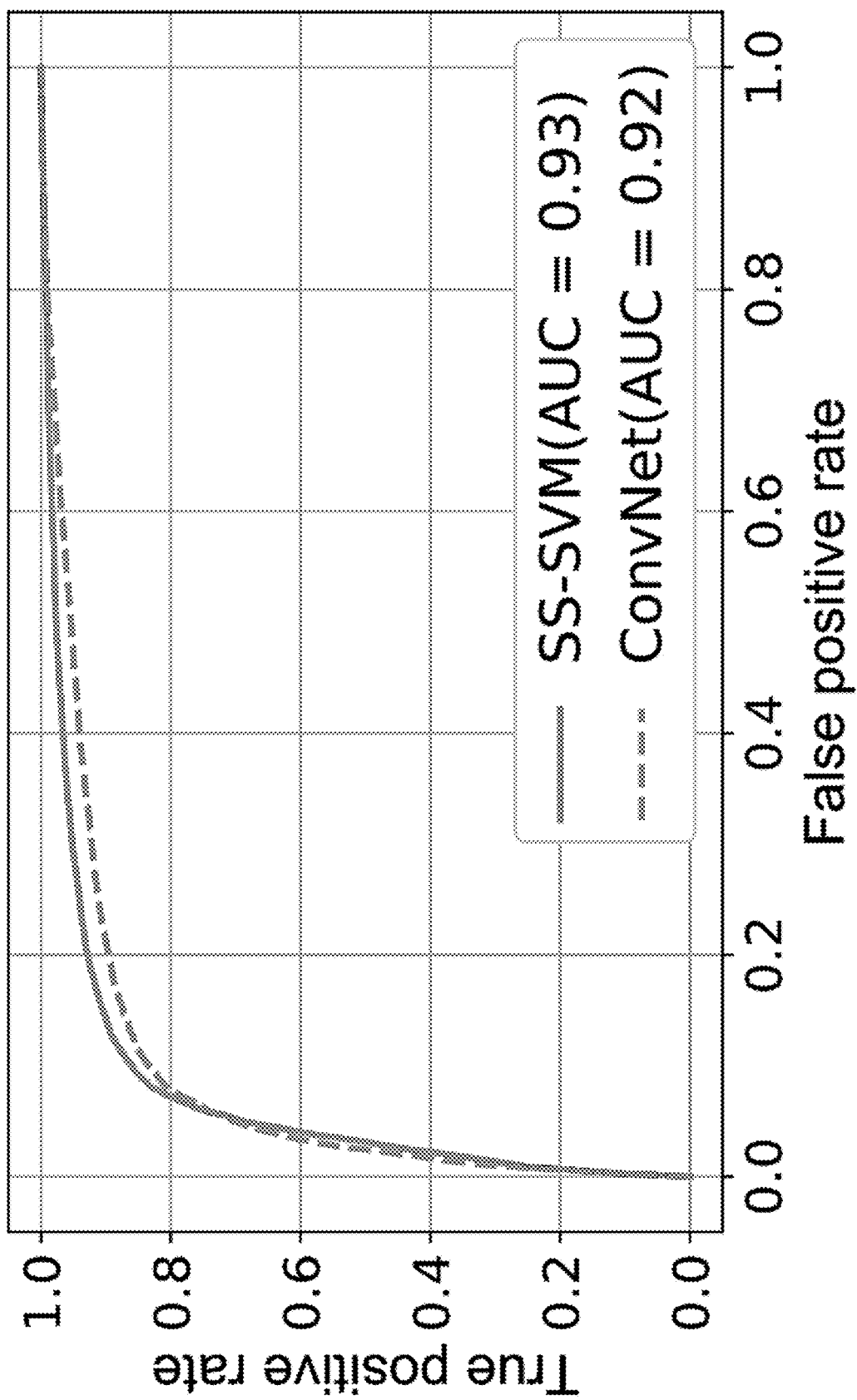
FIG. 2 is a graph of ROC curves comparing two classifiers.

For the comparison we used the dataset described in [11]. The observed ROC curve for both classifiers evaluated on the Baby Cry dataset is shown in FIG. 2. The learning curves for both systems were investigated to understand why the SS-SVM classifier slightly outperforms the ConvNet. FIG. 3 shows error vs. training samples used for both classifiers evaluated on the Baby Cry dataset. The learning rate of the SS-SVM classifier is much higher while the ConvNet is likely to outperform the SS-SVM with more training data. For this analysis, the classifiers were trained on progressively larger subsets of the training dataset and the error rate was calculated for each. The SS-SVM classifier shows faster learning which is consistent with the fact that it possesses much fewer parameters than the ConvNet (2.9M vs. 2 k) and is less likely to suffer from overfit. For the task evaluated, the ConvNet requires 10× more training data than the SS-SVM classifier to achieve 10% error rate (see FIG. 3). This is an important tradeoff in applications that have limited training data or require fast online learning (e.g., reinforcement learning) and should be considered when choosing inference systems.

The size and computational complexity of the classifier was compared with published work on two additional sound classification datasets.

To understand the tradeoffs in computational cost and complexity, we evaluate the SS-SVM classifier on two additional datasets. For all evaluated tasks, the number of features are of the order of the number of training samples, thus also being likely to suffer from overfit.

Figure 4:
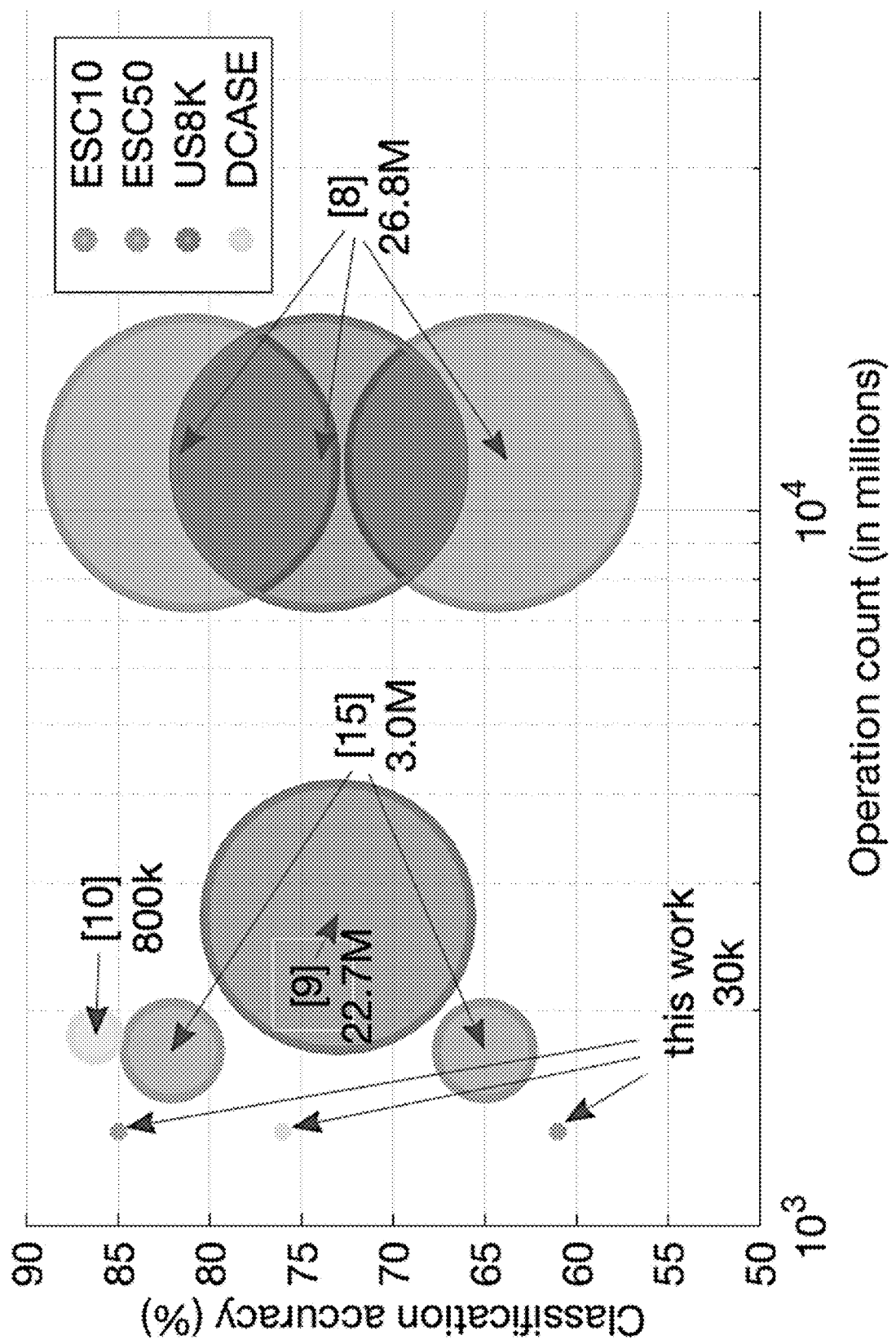
FIG. 4 is a graph comparing four classifiers on different environmental sound datasets.

For the environmental sound classification task we evaluated on the datasets published in [12], [13], [14], [8], [15], [10], namely DCASE 2016 and ESC. These are classification problems with 10-50 classes and therefore require systems with more information capacity than the binary classification task of baby cry. The performance vs. cost tradeoff of the SS-SVM and several recently published deep learning classifiers is summarized in FIG. 4 which shows a comparison of classifiers on different environmental sound datasets. Size of the circles represents the model parameter count. Numbers in brackets are the citation references and the parameter count is labeled below. Operation count is defined as a multiply-add operation and was calculated for a single inference performed on the DCASE 2016 dataset for 30 s clips sampled at 16 kHz. The data points for the US8K dataset [13] were added as an indirect comparison through the work in [8]. Comparison is drawn between systems without resorting to data augmentation. The plot also illustrates the relative sizes of the parameter count for the different classifiers. While the deep learning methods for complex tasks are clearly superior in accuracy, this analysis is useful for determining the cost of using such approaches over smaller and lighter classifiers.

For the task of speaker identification we evaluated the SS-SVM on the TIMIT dataset [16]. The SS-SVM slightly outperforms the ConvNet approach in [17] at a fraction of the model parameters and lies within 3% of the highest-performing systems that employ GMM models with other hand-crafted feature sets [18], [19]. Table II summarizes this comparison.

TABLE II

ACCURACY (IN %) OF CLASSIFIERS ON THE TIMIT DATASET FOR SPEAKER IDENTIFICATION.

| Reference | Accuracy | Params (×$10^6$) | Method |
|---|---|---|---|
| Reynolds [18] | 99.5 | 0.95 | MFCC + GMM |
| Stadelman [19] | 100 | 0.95 | MFCC + GMM |
| Lukic [17] | 97 | 275.97 | ConvNet |
| This work | 97.2 | 1.08 | SS + SVM |

In preferred embodiments of the invention, a mixed-signal approach is used to further increase the computational efficiency of the classifier.

To further increase the energy efficiency of audio classifier systems, some of the feature extraction processing functionality can be implemented in the analog domain, close to the source of the audio signal. This general idea has already been investigated in prior research. The work in [2] presents a 6 nW front-end but limits the signals of interest to fixed tones under 500 Hz and to limited dynamic range. Other work has shown that analog filtering is efficient in performing frequency analysis for the purpose of audio classification. The work in [3] presents a 710 nW front-end and [20] demonstrates a 380 nW front-end, but in both cases the filter banks are based on gm-C topologies, which suffer from limited configurability because the filter bandwidths and center frequencies depend on both the absolute and relative accuracy of capacitors and bias currents. Additionally, in [3] the features must be learned on a chip-to-chip basis by a training step, which is undesirable for mass-produced devices.

We propose an approach that overcomes the above-described limitations while being particularly suitable for the extraction of summary statistics. The system is described in FIG. 5, which shows a classifier system with analog and digital signal chain partition for energy-efficient signal processing. Simplified single-ended circuit implementations of the analog processing is shown as well. A microphone 500 receives acoustic signals and converts them to corresponding electronic signals which are then amplified by a pre-amplifier 502. The amplified signals are processed by an analog front end 504 and then converted to digital signals by an analog-to-digital converter (ADC) 506. The digital signals from the ADC are then processed by a digital back-end 508.

The design follows a mixed-signal approach, where the different sub-blocks are partitioned between analog and digital implementations. Because the feature-set extraction can be approximated using passive switched capacitor circuits, this approach promises to be energy efficient while also offering a simple means for frequency tuning via the system clock and on-chip clock dividers.

Analog front-end 504 includes a filter bank 514 composed of a set of N-path bandpass filters 510, each followed by a passive low-pass mixer 512. The spectral decomposition can be achieved without the use of a mixer (passive or active) through two different approaches: (1) using a higher sample rate in the ADC or (2) sub-sampling each band-limited channel at the appropriate rate. The parallel sub-band signals are combined in an analog multiplexer and then output to the ADC. The analog N-path filters 510 in the subband filter bank 514 have respective center frequencies that can be set by their switched capacitor clock rate and their bandwidths can be set by an adjustable baseband resistor value as described in [21]. Following each filter, we employ a direct-conversion mixer with a low-pass filter at baseband 512 to extract the sub-band envelope signals depicted in the block labeled "envelope" in FIG. 1. The resulting analog signal has a bandwidth of 200 Hz and can therefore be sampled by an analog-to-digital converter 506 sampling at only 400 S/s. The remaining features can be extracted digitally at significantly lower energies than if they were extracted from the raw audio signal, which would be traditionally digitized at 16 kS/s (medium quality audio sample rate).

For the SS-SVM classifier implementation, the digital back-end 508 computes the statistics from the subband signals extracted by the filter bank in the analog front-end. For other classifier implementations, the digital back-end performs all remaining operations needed beyond the initial band-pass filter bank and envelope extraction step.

Figure 5:
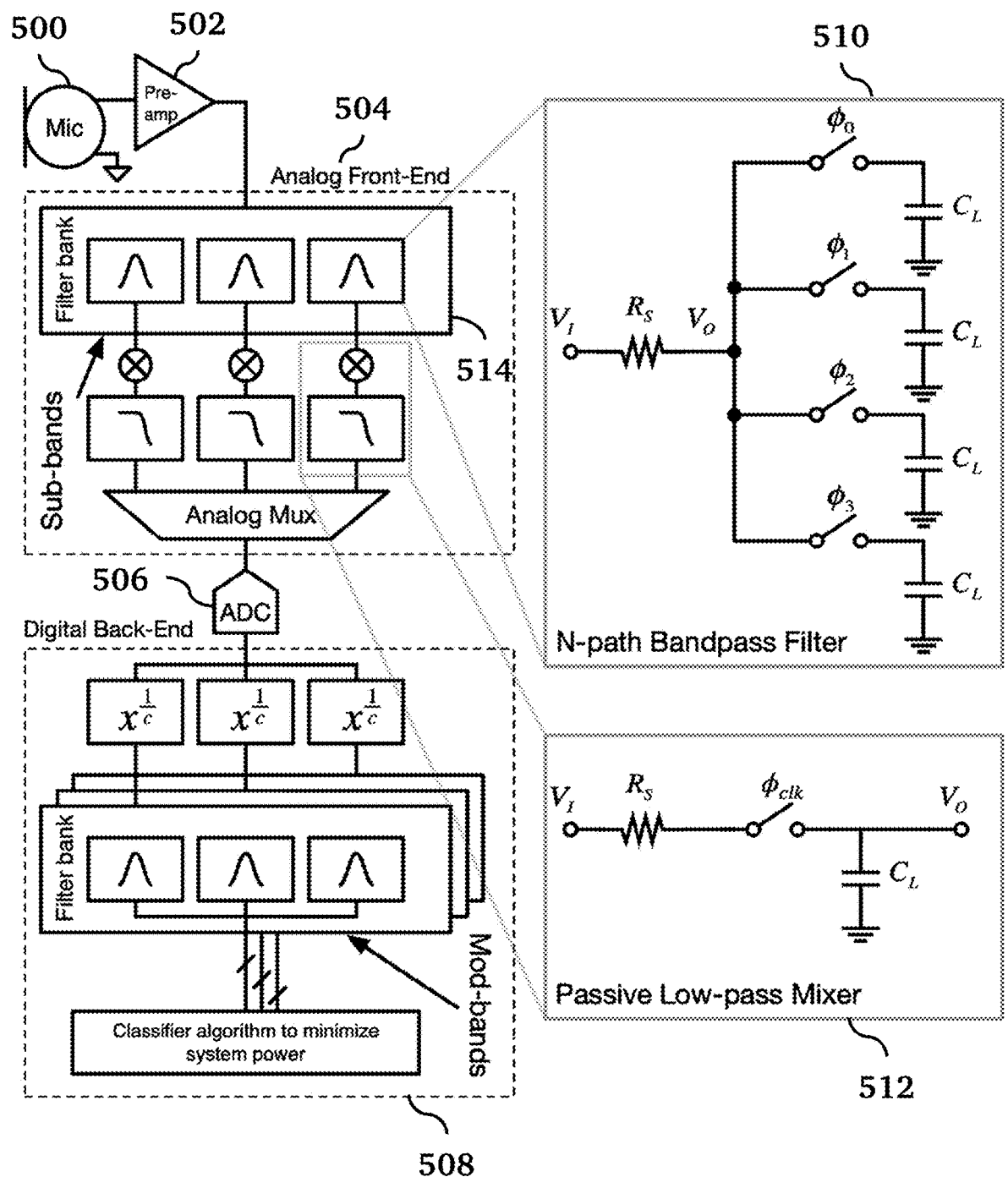
FIG. 5 is a block diagram of a classifier system according to an embodiment of the invention.

These implementation choices change the original signal processing reported in McDermott et al. [4]. The main differences are twofold. First, the bandpass filter banks, which were originally proposed as half-cosine orthogonal filter banks, are implemented as N-path filters with equivalent 3-dB bandwidths. The differences in filter transfer function magnitudes are illustrated in FIGS. 6A-6B. Second, the envelope extraction step, which was originally computed as the magnitude of the analytic signal (i.e., Hilbert transform), is implemented as a passive direct demodulation combined with a low-pass filter at baseband. For simplicity, single-ended versions of these circuit implementation choices are also illustrated in FIG. 5. In actual implementations, their differential counterparts would be used.

Using harmonic transfer matrix models [22] to approximate the N-path filter transfer function and a simplified time-domain model for the demodulation step, we evaluate the effectiveness of the implementation to achieve comparable classification performance. The resulting features are then passed to the same SVM classifier used in the original system described above. From this simulation used on the task of baby cry detection, there was a small degradation observed in the ROC characteristics as shown in FIG. 7.

In one implementation, the analog front-end shown in FIG. 5 was designed in a CMOS 130 nm process in order to simulate the models used for the previous classification results at the transistor level. The efficiency of the architecture is illustrated by the simulated power consumption summarized in Table III. The analog power is spent on level shifters and on driving their respective switches, while the digital power is separated to show how much is used for clocking versus supporting logic. The actual power consumption of a full chip is expected to increase between 20-30% to account for long-distance clock routing and other nonidealities.

FIG. 6 shows a comparison between perfect reconstruction half-cosine filter bank and N-path implementation.

Figure 7:
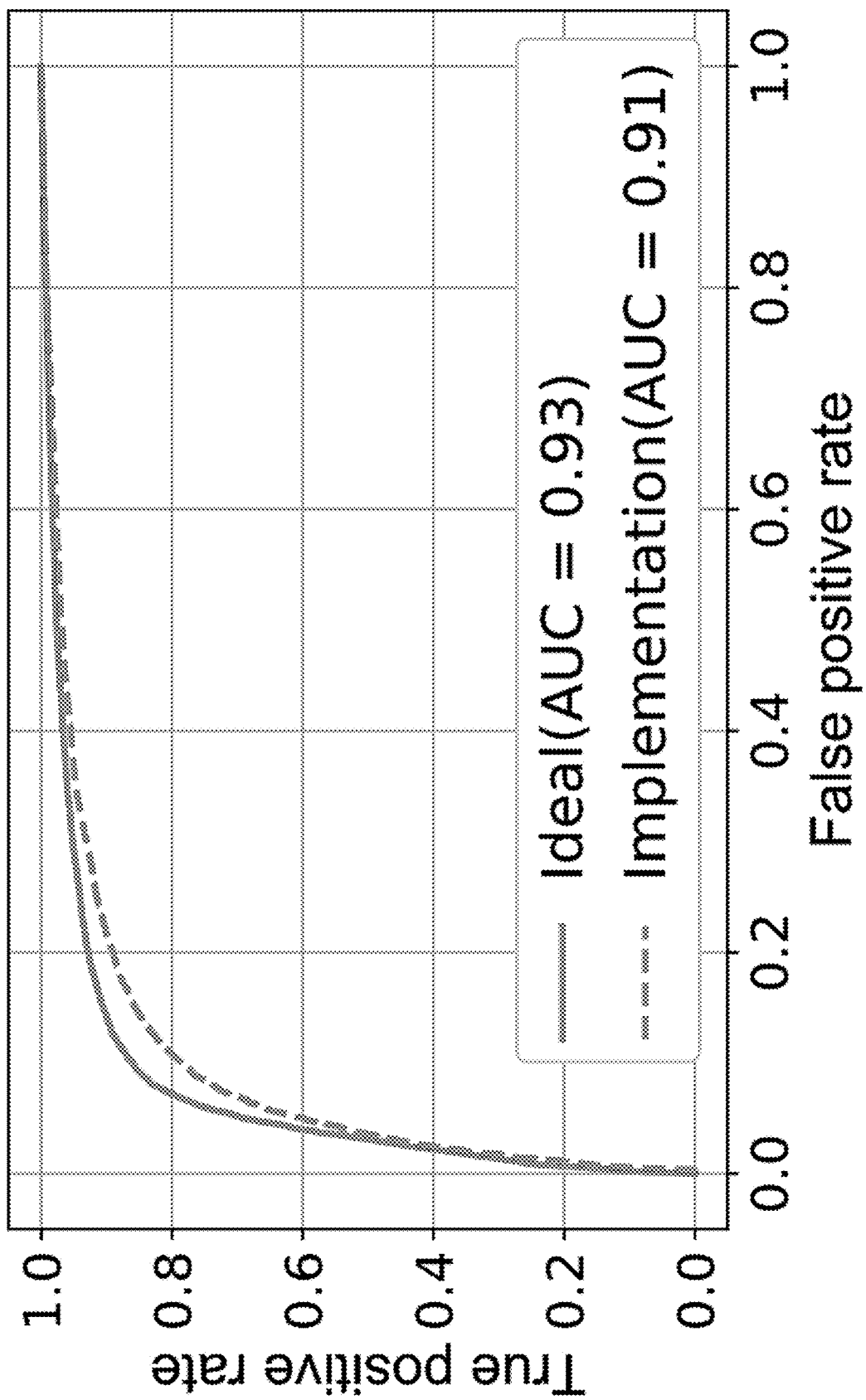
FIG. 7 is a graph of ROC curves using ideal vs. implemented feature extraction according to an embodiment of the invention.

FIG. 7 shows ROC curves for baby cry classification using ideal vs. implemented feature extraction.

TABLE III

SIMULATED POWER CONSUMPTION OF ANALOG FRONT-END

| Digital (nW) | | Analog (nW) | Total (nW) |
|---|---|---|---|
| Clocking | Logic | | |
| 276 | 52 | 361 | 689 |

We have presented a quantitative analysis on a compact audio classification model with test error that converges about ten times faster than a deep learning model, while requiring one to three orders of magnitude fewer parameters for training. In some cases, the classifier accuracy is competitive with deep learning techniques and other engineered feature extraction, while consistently maintaining lower computation count. We have further demonstrated potential benefits of a CMOS mixed-signal circuit implementation to extract the same features and observed that the imposed simplifications do not significantly degrade the classification accuracy.

An additional category of classifiers that can make use of the N-path filter front-end filter bank are deep learning models. For this purpose, the filter bank is used to separate band energies necessary to construct spectrograms. The digital back-end is used to compute the energy based on the samples from the front-end as well as construct the spectrogram and evaluate the deep learning model. To evaluate the performance in these classifier systems we examine keyword spotting performance using the proposed filter bank as a Mel-scale spectrogram extraction step for the audio band in the range of 30-8000 Hz. We use a compact recurrent neural network (RNN) learning model employing Light Gated Recurrent Units (Li-GRU) [23] as a classifier and the Google Speech Commands (GSC) [24] dataset as a benchmark. Spectrograms are extracted with the filter bank using 10 ms frame times resulting in input dimension of 98 frames by 32 channels. The Li-GRU model is used with state dimension $h_t \in R^{32}$ and arranged after an initial convolution layer which takes the input spectrogram and employs a 3×3 kernel, stride of 1, and 128 channels. The network results in under 150 k total trained parameters, a feasible size for embedded microprocessors. Performance comparisons are included to spectrograms generated with ideal triangular filters [5] as well as using our time-domain models. The maximum average accuracy achieved is 92.4% at 9-bit resolution.

Figures 8A, 8B:
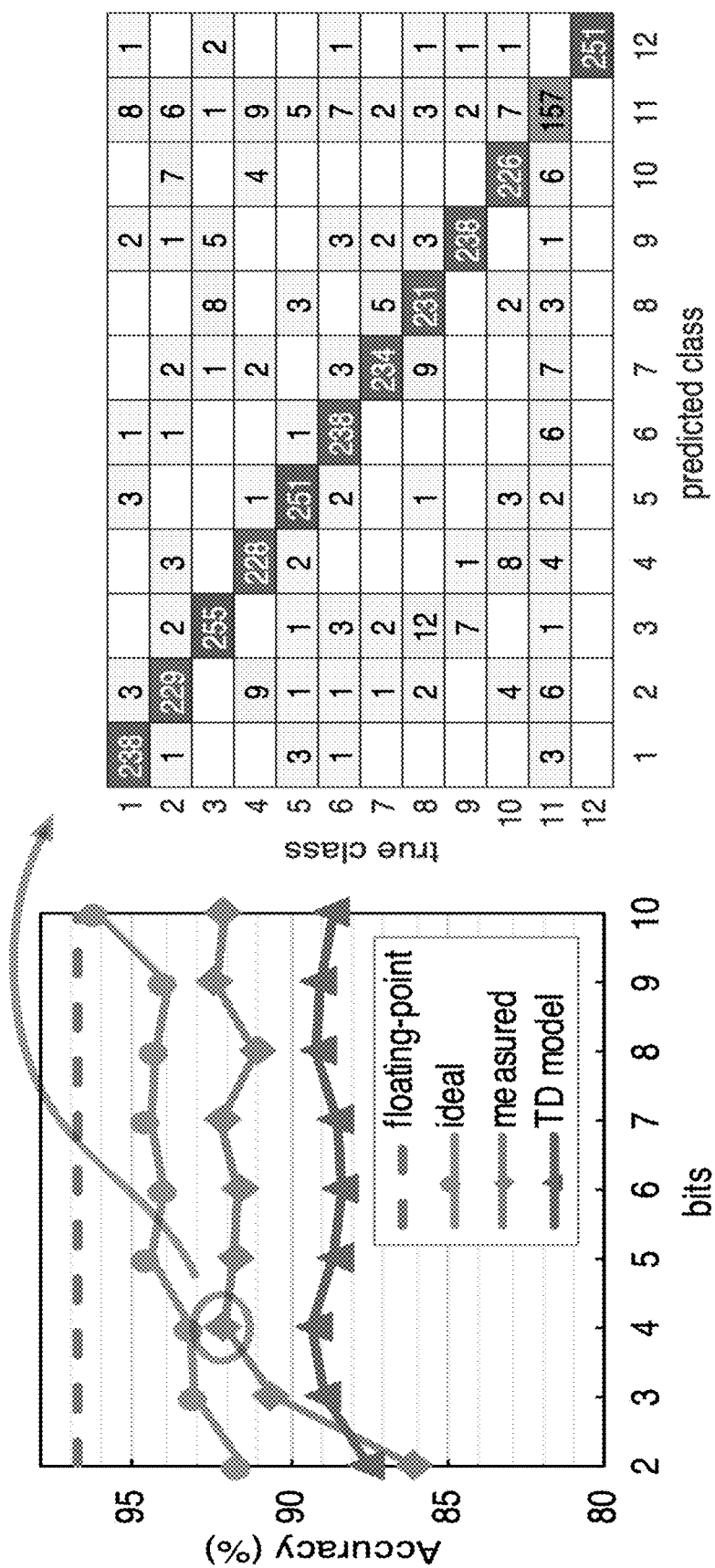
FIG. 8A shows a performance summary for the task of key word spotting over various levels of feature quantization.
FIG. 8B shows a confusion matrix for classification using 4-bit log-quantized features where 92.1% accuracy is achieved.

FIG. 8A shows a performance summary for the task of key word spotting over various levels of feature quantization. FIG. 8B shows a confusion matrix for classification using 4-bit log-quantized features where 92.1% accuracy is achieved. Numbered classes are ordered as: 'yes', 'no', 'up', 'down', 'left', 'right', 'on', 'off', 'stop', 'go', 'unknown', 'silence'.

REFERENCES

[1] N. D. Lane and P. Georgiev, "Can Deep Learning Revolutionize Mobile Sensing?" in International Workshop on Mobile Computing Systems and Applications (HotMobile), 2015.

[2] S. Jeong, Y. Chen, T. Jang, J. M.-L. Tsai, D. Blaauw, H.-S. Kim, and D. Sylvester, "Always-On 12-nW Acoustic Sensing and Object Recognition Microsystem for Unattended Ground Sensor Nodes," IEEE J. Solid-State Circuits, vol. 53, no. 1, pp. 261-274, January 2018.

[3] K. M. H. Badami, S. Lauwereins, W. Meert, and M. Verhelst, "A 90 nm CMOS, 6 uW power-proportional acoustic sensing frontend for voice activity detection," IEEE J. Solid-State Circuits, vol. 51, no. 1, pp. 291-302, January 2016.

[4] J. H. McDermott and E. P. Simoncelli, "Sound texture perception via statistics of the auditory periphery: evidence from sound synthesis." Neuron, vol. 71, no. 5, pp. 926-40, September 2011.

[5] D. P. W. Ellis, X. Zeng, and J. H. McDermott, "Classifying soundtracks with audio texture features," in 2011 IEEE International Conference on Acoustics, Speech and Signal Processing (ICASSP), May 2011, pp. 5880-5883.

[6] T. Virtanen, A. Mesaros, T. Heittola, M. Plumbley, P. Foster, E. Benetos, and M. Lagrange, Detection and Classification of Acoustic Scenes and Events Workshop (DCASE), 2016.

[7] "Acoustic scene classification—dcase2017," http://www.cs.tut.fi/sgn/arg/dcase2017/challenge/task-acoustic-scene-classification-results, [Online; accessed 24 Oct. 2017].

[8] K. J. Piczak, "Environmental Sound Classification with Convolutional Neural Networks," IEEE International Workshop on Machine Learning for Signal Processing, 2015.

[9] J. Salamon and J. P. Bello, "Deep Convolutional Neural Networks and Data Augmentation for Environmental Sound Classification," IEEE Signal Processing Letters, vol. 24, no. 3, pp. 279-283, March 2017.

[10] M. Valenti, S. Squartini, A. Diment, G. Parascandolo, and T. Virtanen, "A convolutional neural network approach for acoustic scene classification," in 2017 International Joint Conference on Neural Networks (IJCNN), 2017.

[11] R. Torres, D. Battaglino, and L. Lepauloux, "Baby cry sound detection: A comparison of hand crafted features and deep learning approach," in International Conference on Engineering Applications of Neural Networks, 2017.

[12] K. J. Piczak, "ESC: Dataset for Environmental Sound Classification," in ACM International Conference on Multimedia (MM), 2015.

[13] J. Salamon and J. P. Bello, "Unsupervised Feature Learning for Urban Sound Classification," in IEEE International Conference on Acoustics, Speech and Signal Processing (ICASSP), 2015.

[14] D. Stowell, D. Giannoulis, E. Benetos, M. Lagrange, and M. D. Plumbley, "Detection and Classification of Acoustic Scenes and Events," IEEE Trans. on Multimedia, vol. 17, no. 10, pp. 1733-1746, October 2015.

[15] Y. Aytar, C. Vondrick, and A. Torralba, "SoundNet: Learning Sound Representations from Unlabeled Video," in Conference on Neural Information Processing Systems (NIPS), 2016.

[16] W. M. Fisher, G. R. Doddington, and K. M. Goudie-Marshall, "The DARPA Speech Recognition Research Database: Specifications and Status," in Proceedings of DARPA Workshop on Speech Recognition, 1986, pp. 93-99.

[17] Y. Lukic, C. Vogt, O. Durr, and T. Stadelmann, "Speaker Identification and Clustering Using Convolutional Neural Networks," in IEEE Inter-national Workshop on Machine Learning for Signal Processing (MLSP), 2016.

[18] D. A. Reynolds, "Speaker Identification and Verification Using Gaussian Mixture Speaker Models," Speech Communication, vol. 17, no. 1-2, pp. 91-108, August 1995.

[19] T. Stadelmann and B. Freisleben, "Unfolding Speaker Clustering Potential," in ACM International Conference on Multimedia (MM), 2009.

[20] M. Yang, C.-H. Yeh, Y. Zhou, J. P. Cerqueira, A. A. Lazar, and M. Seok, "A 1 µW voice activity detector using analog feature extraction and digital deep neural network," in IEEE International Solid-State Circuits Conference (ISSCC), 2018.

[21] M. Darvishi, R. van der Zee, and B. Nauta, "Design of Active N-Path Filters," IEEE J. Solid-State Circuits, vol. 48, no. 12, pp. 2962-2976, December 2013.

[22] S. Hameed, M. Rachid, B. Daneshrad, and S. Pamarti, "Frequency-Domain Analysis of N-Path Filters Using Conversion Matrices," IEEE Trans. on Circuits and Systems II: Express Briefs, vol. 63, no. 1, pp. 74-78, January 2016.

[23] M. Ravanelli, P. Brakel, M. Omologo, and Y. Bengio, "Light gated recurrent units for speech recognition," *IEEE Trans. Emerg. Top. Comput. Intell.*, vol. 2, no. 2, pp. 92-102, April 2018.

[24] P. Warden, "Speech commands: A dataset for limited-vocabulary speech recognition," *CoRR*, vol. abs/1804.03209, 2018.

The invention claimed is:

1. A method for extracting information from acoustic signals, the method comprising:
    receiving the acoustic signals by a microphone;
    processing the received signals in an analog front-end circuit;
    converting the processed signals from the analog front-end circuit to digital signals by sampling at a rate of less than 1 kHz; and
    processing the digital signals by a digital back-end classifier circuit;
    wherein processing the received signals in the analog front-end comprises decomposing the received signals into frequency components using a bank of analog N-path bandpass filters having different subband center frequencies to produce N-path filtered signals;
    wherein processing the received signals in the analog front-end comprises direct down-converting the N-path filtered signals to zero frequency baseband using analog passive low-pass mixers to produce subband envelope signals.

2. A device for extracting information from acoustic signals, the device comprising:
    a microphone;
    an analog front-end circuit;
    a digital-to-analog converter configured to sample at a rate of less than 1 kHz; and
    a digital back-end classifier circuit;
    wherein the analog front-end comprises a bank of analog N-path bandpass filters having different subband center frequencies configured to decompose the received signals into frequency components to produce N-path filtered signals;
    wherein the analog front-end comprises analog passive low-pass mixers configured to direct down-convert the N-path filtered signals to produce subband envelope signals at zero frequency baseband.

* * * * *